(12) United States Patent
Parascandola et al.

(10) Patent No.: US 11,175,389 B2
(45) Date of Patent: *Nov. 16, 2021

(54) OPTICAL SENSOR DEVICE WITH DEEP AND SHALLOW CONTROL ELECTRODES

(71) Applicants: Infineon Technologies AG, Neubiberg (DE); pmdtechnologies ag, Siegen (DE)

(72) Inventors: Stefano Parascandola, Dresden (DE); Henning Feick, Dresden (DE); Matthias Franke, Haiger (DE); Dirk Offenberg, Dresden (DE); Jens Prima, Siegen (DE); Robert Roessler, Siegen (DE); Michael Sommer, Siegen (DE)

(73) Assignees: Infineon Technologies AG; pmdtechnologies ag

( * ) Notice: Subject to any disclaimer, the term of this patent is extended or adjusted under 35 U.S.C. 154(b) by 0 days.

This patent is subject to a terminal disclaimer.

(21) Appl. No.: 16/747,084

(22) Filed: Jan. 20, 2020

(65) Prior Publication Data

US 2020/0158841 A1 May 21, 2020

Related U.S. Application Data

(63) Continuation of application No. 15/783,062, filed on Oct. 13, 2017, now Pat. No. 10,545,225.

(30) Foreign Application Priority Data

Oct. 14, 2016 (DE) ..................... 10 2016 220 164.6
Nov. 28, 2016 (DE) ..................... 10 2016 223 568.0

(51) Int. Cl.
*H01L 27/146* (2006.01)
*G01S 7/4914* (2020.01)
(Continued)

(52) U.S. Cl.
CPC .......... *G01S 7/4914* (2013.01); *G01S 7/4915* (2013.01); *G01S 17/36* (2013.01); *H01L 27/14603* (2013.01); *H04N 13/257* (2018.05)

(58) Field of Classification Search
CPC ......... H01L 27/14603; H01L 27/14614; H01L 27/14812; G01S 17/36
See application file for complete search history.

(56) References Cited

U.S. PATENT DOCUMENTS 6,825,455 B1 11/2004 Schwarte
10,545,225 B2 * 1/2020 Parascandola ........ G01S 7/4914
(Continued)

FOREIGN PATENT DOCUMENTS

DE 102011056369 A1 6/2013
DE 102013102061 A1 9/2014
(Continued)

*Primary Examiner* — Thanh Luu
(74) *Attorney, Agent, or Firm* — Design IP

(57) ABSTRACT

An optical sensor device configured to detect a time of flight of an electromagnetic signal includes a semiconductor substrate having a main surface and a conversion region configured to convert at least a fraction of the electromagnetic signal into photo-generated charge carriers; a first control electrode formed in a trench extending from the main surface into the semiconductor substrate; a second control electrode disposed directly or indirectly on the main surface; a control circuit configured to apply a varying first potential to the first control electrode and to apply a varying second potential to the second control electrode, where the varying second potential has a fixed phase relationship to the first varying potential, to generate electric potential distributions in the conversion region to direct the photo-generated charge carriers; and a readout node arranged in the semiconductor substrate and configured to detect the directed photo-generated charge carriers.

27 Claims, 11 Drawing Sheets

(51) Int. Cl.
    *G01S 7/4915*     (2020.01)
    *G01S 17/36*     (2006.01)
    *H04N 13/257*     (2018.01)

(56) References Cited

U.S. PATENT DOCUMENTS

| | | |
|---|---|---|
| 2009/0244514 A1 | 10/2009 | Jin et al. |
| 2013/0062604 A1 | 3/2013 | Kautzsch |
| 2013/0256546 A1 | 10/2013 | Seliuchenko et al. |
| 2014/0347538 A1* | 11/2014 | Toda ................ H01L 27/14689 348/308 |
| 2014/0374808 A1 | 12/2014 | Franke et al. |
| 2015/0115291 A1 | 4/2015 | Kim et al. |
| 2016/0073093 A1 | 3/2016 | Kautzsch |

FOREIGN PATENT DOCUMENTS

| | | |
|---|---|---|
| DE | 102014113037 A1 | 3/2016 |
| EP | 1009984 B1 | 11/2003 |

\* cited by examiner

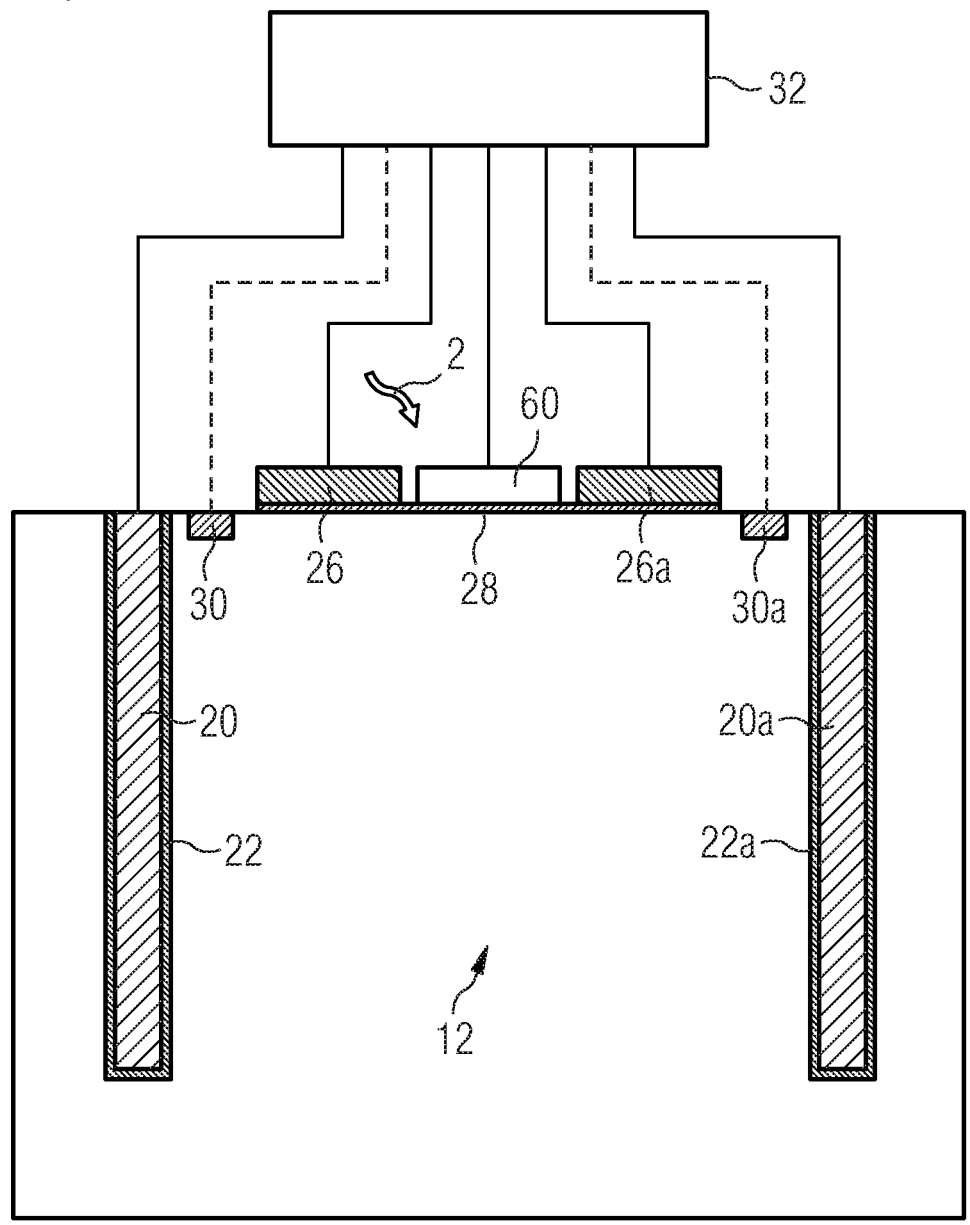

OPTICAL SENSOR DEVICE WITH DEEP AND SHALLOW CONTROL ELECTRODES

CROSS-REFERENCE TO RELATED APPLICATIONS

This application is a continuation of U.S. patent application Ser. No. 15/783,062 filed Oct. 13, 2017, which claims the benefit of German Patent Application No. 10 2016 220 164.6 filed Oct. 14, 2016 and German Patent Application No. 10 2016 223 568.0 filed Nov. 28, 2016, which are incorporated by reference as if fully set forth.

FIELD

This disclosure relates in general to the field of integrated circuits and, more specifically, to the field of optical sensor devices adapted to detect a time of flight of an electromagnetic signal.

BACKGROUND

In some optical sensor devices control electrodes in a photodetector are used to demodulate photo-generated charge carriers. An electromagnetic signal, e.g. light, generated by a radiation source and amplitude-modulated by a modulation signal is directed to an object and reflected to the photodetector. A demodulation signal in-phase with the modulation signal or having a fixed phase relationship to the modulation signal is applied to the control electrodes in the photodetector. The photo-generated charge carriers are directed to a first readout node or a second readout node depending on the demodulation signal applied to the control electrodes. The photo-generated charge carriers directed to the readout nodes are detected and a phase-shift between the modulation signal and the electromagnetic signal reflected from the object and detected at the photodetector is determined. Therefore, the time of flight of the electromagnetic signal may be determined from the detected photo-generated charge carriers. In other words, mixing of the received radiation with the demodulation signal is used to determine time of flight information from the phase-shift between the radiation emitted by the radiation source and the radiation received by the optical sensor device. Thus, such optical sensor devices are also called photo-mixing devices (PMD) or demodulating detectors.

To direct the photo-generated charge carriers, control electrodes are used. In conventional sensor devices, a single kind of control electrodes is used. To be more specific, either photo-gates, or trench gates, or guide field electrodes for a current-assisted photonic demodulation, have been used.

However, the current design of optical sensor devices suffers from limitations of the quality of the sensor signal.

Therefore, an enhanced approach of converting the received electromagnetic signal into an electrical signal may be desired.

SUMMARY

Embodiments provide for an optical sensor device to detect a time of flight of an electromagnetic signal, the optical sensor device including: a semiconductor substrate including a conversion region to convert at least a fraction of the electromagnetic signal into photo-generated charge carriers; a deep control electrode which is formed in a trench extending into the semiconductor substrate; a shallow control electrode, the deep control electrode extending deeper into the semiconductor substrate than the shallow control electrode; a control circuit configured to apply to the deep control electrode a varying first potential and to apply to the shallow control electrode a varying second potential having a fixed phase relationship to the varying first potential applied to the deep control electrode, to generate an electric potential distribution within the conversion region to direct the photo-generated charge carriers; and at least one readout node to detect the directed charge carriers.

Using a deep control electrode arranged in a trench extending into the semiconductor substrate and a shallow control electrode extending less into the semiconductor substrate than the deep control electrode or not extending into the semiconductor substrate at all permits implementing a horizontal deflection or direction of photo-generated charge carriers near the surface of the semiconductor substrate by means of the shallow control electrode and deeper within the semiconductor substrate by means of the deep control electrode. Varying potentials with a fixed phase relationship, e.g. in-phase, to each other are applied to the deep and shallow control electrodes. Thus, increased performance may be achieved when compared to optical sensor devices including either photo-gates or trench gates or guide field electrodes to deflect or direct the photo-generated charge carriers.

Embodiments provide for an optical sensor device, in which the deep control electrode is a trench gate control electrode, and in which the shallow control electrode comprises a photo-gate electrode separated from an illuminated surface on the semiconductor substrate by an isolating material or comprises a doped region formed in the semiconductor substrate, bordering to the conversion region and having a higher doping concentration and the same doping type as the conversion region. Thus, embodiments provide a combination of a trench gate control electrode with a control electrode arranged in or on a surface of the semiconductor substrate so that deflection of photo-generated charge carriers may be achieved in different depths of the semiconductor substrate and the conversion region.

BRIEF DESCRIPTION OF THE DRAWINGS

Embodiments of the disclosure will be discussed subsequently referring to the enclosed drawings, wherein:

FIG. 4 shows a schematic cross-sectional view showing an optical sensor device including a third shallow control electrode arranged between first and second shallow control electrodes;

DETAILED DESCRIPTION

In the following, embodiments of the disclosure will be described in further detail. Elements shown in the respective figures having the same or a similar functionality will have associated therewith the same reference signs.

Figure 1:
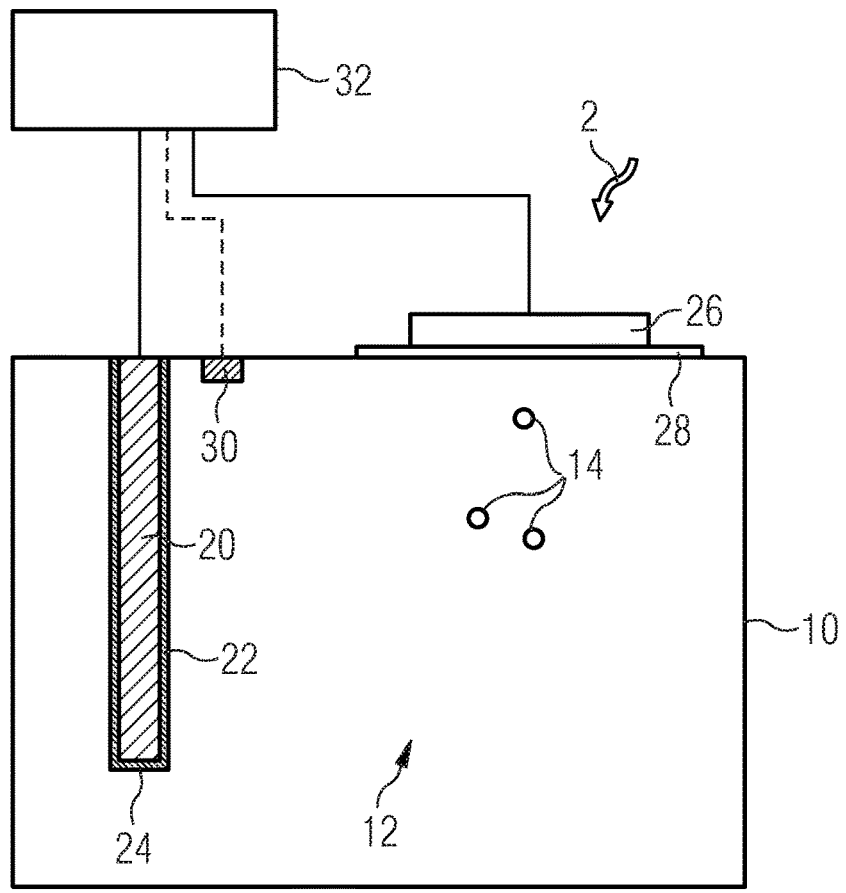
FIG. 1 shows an optical sensor device including a deep control electrode, a shallow control electrode and a readout node.

FIG. 1 shows an optical sensor device to detect a time of flight of an electromagnetic signal, such as an infrared radiation or a light signal, from an object to the optical sensor device. In the Figures, the electromagnetic signal incident onto the optical sensor device is indicated by an arrow 2.

The optical sensor device comprises a semiconductor substrate 10. The semiconductor substrate 10 comprises a conversion region 12, which is generally the region of semiconductor 10 in which the electromagnetic signal 2 is received. In the conversion region 12 the electromagnetic signal 2 is converted into photo-generated charge carriers 14.

The optical sensor device comprises a deep control electrode 20 which is separated from the semiconductor substrate 10 by an isolating material 22. The deep control electrode 20 and the isolating material 22 are formed in a trench 24 extending into the semiconductor substrate 10. Thus, the deep control electrode 20 may be referred to as a trench gate control electrode.

The optical sensor device comprises a shallow control electrode 26. In the embodiment shown in FIG. 1, the shallow control electrode 26 comprises a gate electrode separated from an illuminated surface of the semiconductor substrate 10 by an isolating material 28. In one or more embodiments, the shallow gate electrode 26 may be a photo-gate, i.e. a gate electrode transparent for the incident radiation to be detected. In one or more embodiments, the shallow control electrode 26 may be a gate electrode not arranged within a trench of the semiconductor substrate.

A readout node 30 is arranged in the semiconductor substrate 10 adjacent to the conversion region 12. The optical sensor device comprises a control circuit 32 configured to apply to the deep control electrode 20 a varying first potential and to apply to the shallow control electrode 26 a varying second potential having a fixed phase relationship to varying first potential applied to the deep control electrode, to generate electric potential distributions in the conversion region 12, by which the photo-generated charge carriers 14 in the conversion region 12 may be directed to the readout node 30. In one or more embodiments, the varying first potential may be in-phase with the varying second potential.

To this end, corresponding terminals of the control circuit 32 may be connected to the deep and shallow control electrodes 20 and 26 as shown in FIG. 1. In addition, control circuit 32 may be connected to readout node 30 in order to detect photo-generated charge carriers arriving at readout node 30 and collected at readout node 30.

Figure 2:
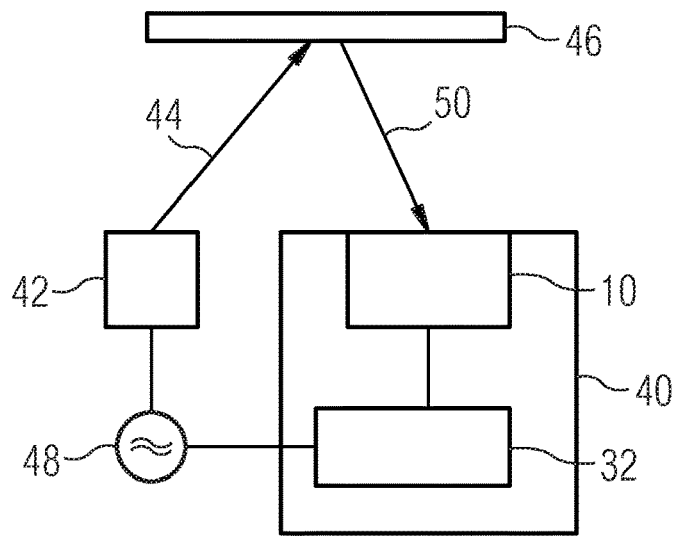
FIG. 2 shows a time of flight sensor system using an optical sensor device.

Before describing operation of the optical sensor device shown in FIG. 1, reference is made to FIG. 2 showing a system comprising an optical sensor device 40. The optical sensor device 40 comprises the semiconductor substrate 10 and the control circuit 32. The system shown in FIG. 2 further comprises a light source 42, such as a laser 42. The light source 42 emits an electromagnetic signal 44 to an object 46. The electromagnetic signal is modulated by a modulation signal from a modulator 48. The electromagnetic signal 44 is reflected at the object 46 and the reflected electromagnetic signal 50 is incident on the semiconductor substrate 10 of the optical sensor device 40.

The measurement principle of this arrangement is based essentially on the fact that the time of flight of the emitted and reflected radiation 44, 50 may be determined based on the phase-shift of the radiation emitted from radiation source 42 and the radiation received at optical sensor device 40. A modulation signal having a specific modulation frequency is applied to radiation source 42. A demodulation signal in phase with the modulation signal or having a fixed phase relation to the modulation signal is applied to the deep and shallow control electrodes. The modulation signal may be a periodic signal, such as a square wave or a sinusoidal wave. The radiation source 42 emits the radiation signal 44 with a specific phase position. The reflected radiation 50 has a specific phase-shift when compared to the emitted radiation. In the optical sensor device, the signal having the specific phase position of the emitted modulation signal may be mixed with the received signal, wherein the phase-shift may be determined from the resulting signal. To this end, the optical sensor device 40 may be connected to the modulator 48. Control circuit 32 may apply the modulation signal to the deep and shallow control electrodes to apply the varying potentials in phase with each other thereto. In one or more embodiments, radiation source 42 and modulator 48 may be integrated into the optical sensor device. In one or more embodiments, there may be a fixed known phase-shift between the varying potentials applied to deep and shallow control electrodes and the modulation signal with which radiation source 42 modulates the emitted radiation 44.

In one or more embodiments, the conversion region may be a lightly doped semiconductor region. For example, the conversion region may be p-type doped. The readout nodes disclosed herein may be formed by a doped region having a higher doping concentration and a different doping type than the conversion region. If the conversion region is p-type doped, the readout node may be $n^+$-doped. Thus, the readout nodes disclosed herein may be formed as readout diodes.

In operation, a reverse voltage may be applied to the readout node 30. The reverse voltage may be applied by means of control circuit 32. In addition, varying potentials having a fixed phase relationship to each other may be applied to the deep control electrode 20 and the shallow control electrode 26. The varying potentials may be voltages with the same polarity as the reverse voltage applied to the readout node and a magnitude less than the magnitude of the reverse voltage applied to the readout node. For example, a reverse voltage in the order of 2.8 volt may be applied to the readout node and the varying potential applied to the deep and shallow control electrodes may vary between zero volt and about 0.8 volt.

When applying the potential to the deep control electrode 20 and the shallow control electrode 26, electric potential distributions are generated in the semiconductor substrate, by which photo-generated minority charge carriers are moved in the direction towards the respective control electrode and, therefore, towards the readout node. Deflection of the photo-generated minority charge carriers is larger during phases in which the varying potential is higher and lower during phases in which the varying potential is lower. Thus, the number of photo-generated minority charge carriers arriving at the readout node 30 will depend on the phase relationship between the emitted electromagnetic signal and the received electromagnetic signal. Thus, the time of flight of the electromagnetic signal from the object to the optical sensor device and, therefore, the distance of the object from the optical sensor device may be determined by detecting the photo-generated charge carriers arriving at the readout node.

In one or more embodiments, the deep control electrode is a trench gate electrode. In case of a p type semiconductor substrate, a varying positive voltage may be applied to the trench gate electrode. Thus, a depletion region (space charge region) may be generated in the region of the semiconductor substrate surrounding the trench gate electrode. Photo-generated minority charge carriers may be attracted in a lateral direction toward the trench gate electrode and then moved in a vertical direction toward the readout node through the depletion region. Accordingly, photo-generated minority charge carriers generated in deeper parts of the conversion region may be attracted by the potential applied to the deep control electrode, may enter the depletion region forced by applying the varying potential to the deep control electrode and are moved within the depletion region of the deep control electrode vertically toward the readout node.

In one or more embodiments, the shallow control electrode comprises a gate electrode separated from an illuminated surface of the semiconductor substrate by an isolating material. Minority charge carriers (electrons in case of a p-type substrate) may be moved vertically by the potential (positive voltage in case of a p-type substrate) to the top of the semiconductor substrate and may enter the depletion region under the gate electrode. From there, charge carriers may be moved in a lateral direction towards the readout node due to the reverse potential applied to the readout node.

In one or more embodiments, the shallow gate electrode comprises a photo-gate electrode. As used herein, the term "photo-gate electrode" refers to a gate electrode transparent or at least partially transparent for the electromagnetic signal to be detected. Generally, the photo-gate electrode may be arranged within the beam path of the electromagnetic signal.

In one or more embodiments, an improved performance may be achieved by means of a combination of sensitivity and demodulation contrast. Using the deep control electrode extending deeper into the semiconductor substrate than the shallow control electrode enables increasing the sensitivity due to extension of the depletion zone into a larger depth. Using the shallow control electrode enables increasing the demodulation contrast for charge carriers generated near the shallow control electrode, i.e. charge carriers generated closer to the surface of the semiconductor substrate.

In one or more embodiments, the deep control electrode is arranged on a first side of the at least one readout node and the shallow control electrode is arranged on a second side of the at least one readout node in a plan view of the semiconductor substrate. For example, in the embodiment shown in FIG. 1, the deep control electrode 20 is arranged on a first side (the left side) of the at least one readout node 30 and the shallow control electrode 26 is arranged on a second side (the right side) of the at least one readout node in a plan view of the semiconductor substrate 10. Such an arrangement enables increasing the efficiency in an improved manner.

In one or more embodiments of the present disclosure, the shallow control electrode may comprise a doped region formed in a semiconductor substrate, bordering the conversion region and having a higher doping concentration and the same doping type as the conversion region. Such embodiments enable a current-assisted photonic demodulation at the surface of the semiconductor substrate. One such example will be described later referring to FIG. 14.

In one or more embodiments, a separation gate electrode may be arranged on the semiconductor substrate adjacent to the at least one readout node. In one or more embodiments, the separation gate electrode may be arranged to surround the at least one readout node in a plan view of the semiconductor substrate. The separation gate electrode may be effective to decouple modulated parts, such as the shallow and deep control electrodes, and the readout node. In other words, the separation gate may be effective to avoid or at least reduce capacitive coupling of the electrical modulation signal of the shallow and deep control electrodes into the readout node. Thus, the separation gate electrode may support retaining the charge carriers even in case the potential applied to the deep and shallow control electrodes is removed. To this end, a constant positive potential (in case of a p type substrate) or a constant negative potential (in case of a n type substrate) may be applied to the separation gate electrode. The magnitude of the potential applied to the separation gate may be less than the magnitude of the reverse voltage applied to the readout node but higher than the maximum potential applied to the deep and shallow control electrodes.

In one or more embodiments, the deep control electrode and the shallow control electrode may be electrically connected to each other. In such embodiment, the same varying potential may be applied to the deep and shallow control electrodes in a simple manner.

In one or more embodiments, the varying potential applied to the deep and shallow control electrodes is a demodulation signal having a fixed phase relationship with a modulation signal with which the electromagnetic signal is modulated. In one or more embodiments, the demodulation signal is in-phase with the modulation signal. Thus, a phase difference between the emitted electromagnetic signal and the received electromagnetic signal may be determined in an easy manner.

Generally, the semiconductor substrate may have a width, a length, and a thickness. Generally, the term "plan view" refers to a view in the thickness direction, i.e. a view onto a plane defined by the length and the width of the substrate. Generally, the term vertical may mean in the thickness direction and the term lateral may mean parallel to the plane defined by the length and the width of the substrate.

In one or more embodiments, the term "shallow" as used in connection with the control electrodes means in or on the surface of the semiconductor substrate (i.e. the surface defined by the length and the width thereof). In one or more embodiments, a shallow control electrode may be a planar structure having a width and a length larger than a thickness thereof, wherein a plane defined by the width and the length of the shallow control electrode is arranged in parallel to the plane defined by the width and the length of the semiconductor substrate.

In one or more embodiments, the term "deep" as used in connection with the control electrodes means that the control electrode is arranged in a trench extending into the substrate to a depth which is at least two times or five times larger the width of the trench. In one or more embodiments, the deep control electrode may be a planar structure having a width and a length larger than a thickness thereof, wherein a plane defined by the width and the length of the deep control electrode may be arranged in a plane which is perpendicular to the plane defined by the width and the length of the semiconductor substrate. In one or more embodiments, the plane defined by the width and the length of the deep control electrode may be perpendicular to the plane defined by the width and the length of the shallow control electrode.

In one or more embodiments, the optical sensor device comprises first and second deep control electrodes, first and second shallow control electrodes, and first and second readout nodes, wherein, in a plan view of the semiconductor substrate, the first and second shallow control electrodes are arranged between first and second readout nodes and between the first and second deep control electrodes. The control circuit may be configured to apply to the first deep control electrode the varying first potential, to apply to the first shallow control electrode the varying second potential, to apply to the second deep control electrode a varying third potential, and to apply to the second shallow control electrode a varying fourth potential having a fixed phase relationship to the third varying potential. The third and fourth varying potentials may comprise a phase shift when compared to the first and second varying potentials. The phase shift may be 180° so that the varying potentials applied to the second deep and shallow electrodes are in anti-phase to the varying potentials applied to the first deep and shallow control electrodes. Thus, electric potential distributions may be generated in the conversion region, by which the photo-generated charge carriers in the conversion region are directed. In one or more embodiments, the photo-generated charge carriers may be separated dependent on the time of flight of the electromagnetic signal. Thus, direction or separation of the photo-generated charge carriers may be detected in an efficient and liable manner.

In one or more embodiments, the first and second varying potentials may be in-phase to each other. In one or more embodiments, the third and fourth varying potentials may be in-phase to each other. In one or more embodiments, the respective first control electrodes may be electrically connected to each other and the respective second control electrodes may be electrically connected to each other.

Figure 3A:
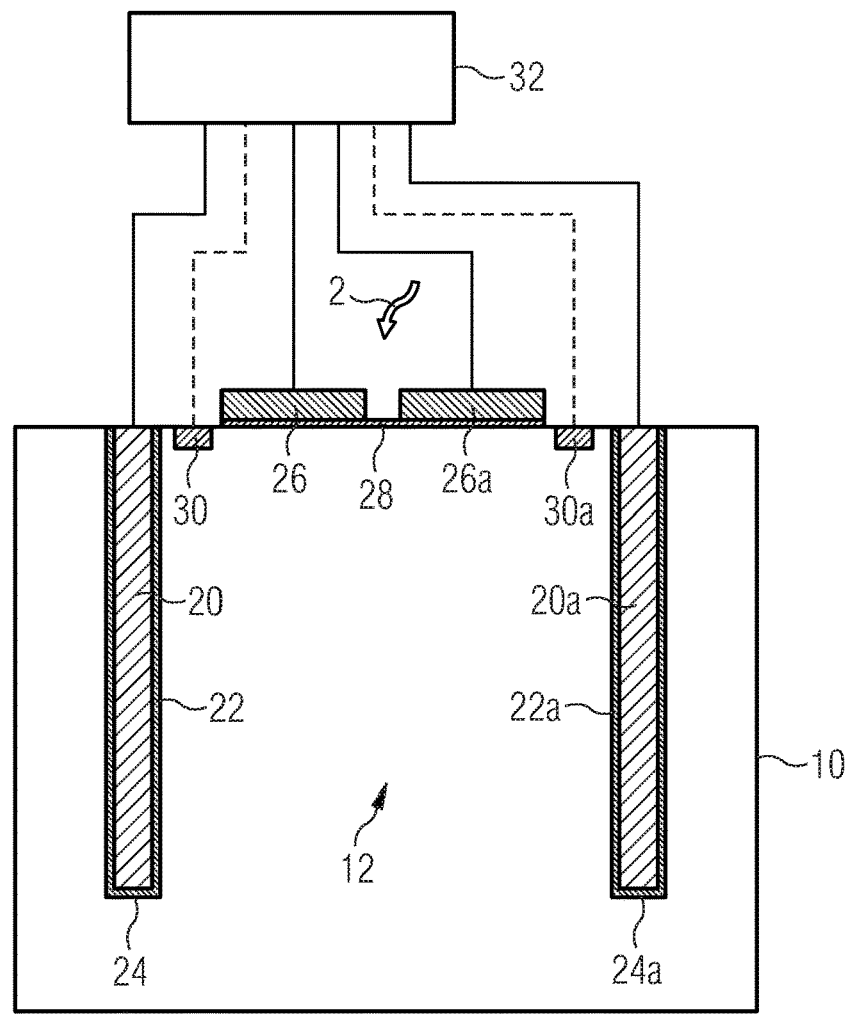
FIG. 3A shows a schematic cross-sectional view of an optical sensor device including two deep control electrodes, two shallow control electrodes and two readout nodes.
Figure 3B:
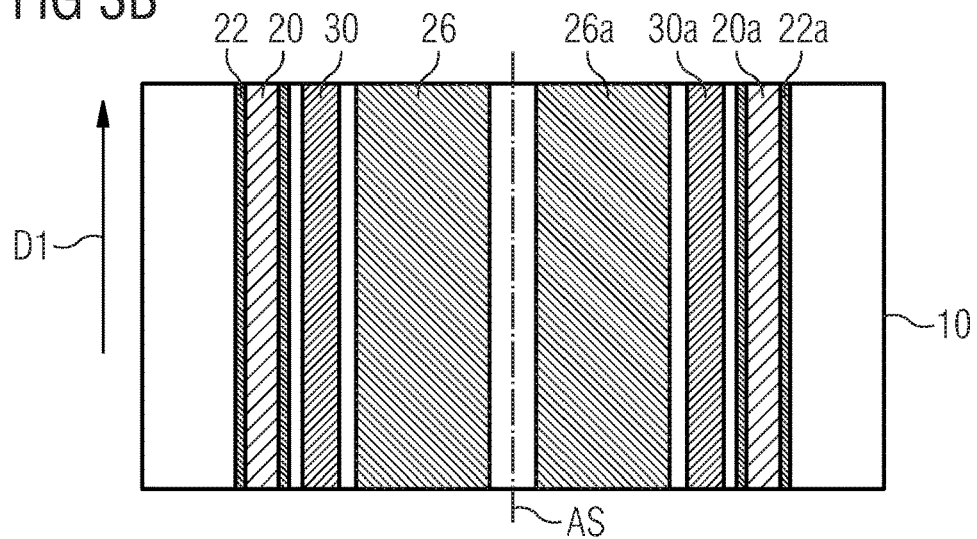
FIG. 3B shows a schematic top view of the optical sensor device shown in FIG. 3A.

FIG. 3A shows a schematic cross-sectional view and FIG. 3B shows a schematic plan view of an optical sensor device comprising a first deep control electrode 20, a second deep control electrode 20a, a first shallow control electrode 26 and a second shallow control electrode 26a. The first and second deep control electrodes 20 and 20a are arranged in respective trenches 24, 24a and isolated from the semiconductor substrate by means of respective isolating layers 22 and 22a. The first and second deep control electrodes 20 and 20a may form trench gate electrodes. The first and second shallow control electrodes 26 and 26a are isolated from an illuminated surface of the semiconductor substrate by an isolating layer 28.

A first readout node 30 is arranged between the first deep control electrode 20 and the first shallow control electrode 26. A second readout node 30a is arranged between the second deep control electrode 20a and the second shallow control electrode 26a. The first and second deep control electrodes 20, 20a, the first and second shallow control electrodes 26, 26a and the first and second readout nodes 30, 30a may be electrically connected to a control circuit 32 as indicated in FIG. 3A by respective lines. Control circuit 32 may be configured to apply appropriate potentials to the respective electrodes and readout nodes and may be configured to detect charge carriers collected at the respective readout node.

As shown in FIG. 3B, the control electrodes may be formed as elongated structures arranged in parallel to a first direction D1. The control electrodes and the readout nodes may be arranged symmetrically with respect to an axis of symmetry AS, as indicated in FIG. 3B.

In one or more embodiments, the first deep control electrode 20 and the first shallow control electrode 26 may be electrically connected to each other. In one or more embodiments, the second deep control electrode 20a and the second shallow control electrode 26a may be electrically connected to each other.

In operation, the control circuit applies to the first deep control electrode 20 and the first shallow control electrode 26 varying potentials as explained above with respect to FIG. 1. Moreover, the control circuit applies to the second deep control electrode 20a and the second shallow control electrode 26a varying potentials. Generally, the varying potentials applied to the second deep and shallow electrodes may have a phase shift with respect to the varying potentials applied to the first deep and shallow control electrodes. In one or more embodiments, the varying potentials applied to the second deep and shallow control electrodes will be in anti-phase with the varying potentials applied to the first deep and shallow control electrodes. In one or more embodiments, the control circuit may determine the time of flight of the electromagnetic signal based on a difference of the amount of charge carriers at the first readout node and the amount of charge carriers at the second readout node. In one or more embodiments, such an evaluation may be conducted in a evaluator separate from the optical sensor device.

Figure 17:
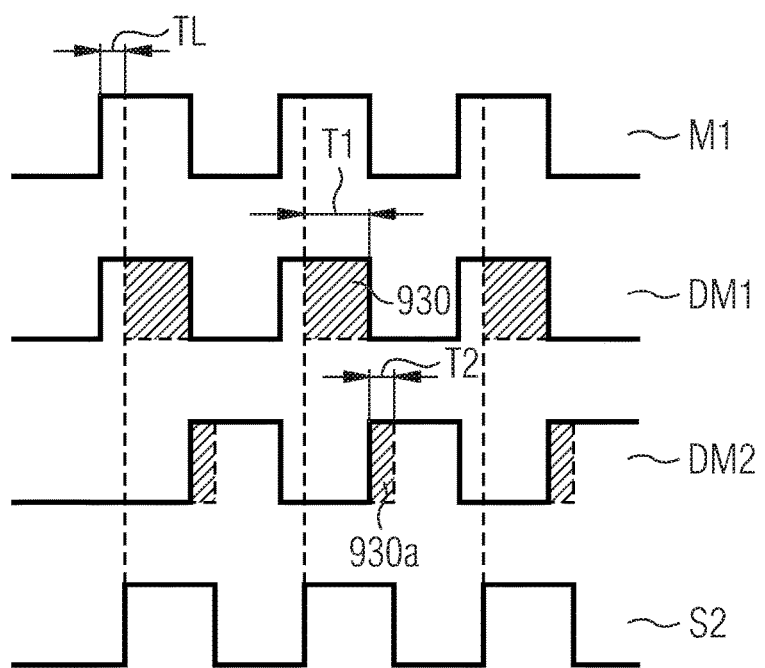
FIG. 17 shows a timing diagram for explaining the operation of embodiments of optical sensor devices.

A principle of phase measurement, which may be applied to embodiments of optical sensor devices comprising first and second deep and shallow control electrodes and first and second readout nodes as described herein, is now shortly explained referring to FIG. 17. The measurement principle is based substantially on the fact that the time of flight of an emitted electromagnetic signal (light) which is reflected from an object to the optical sensor device may be determined from the phase difference of the emitted signal and the received signal.

In FIG. 17, M1 represents a modulation signal with which the emitted signal is modulated. Signal S2 represents the electromagnetic signal received at the optical sensor device. Signal DM1 represents a demodulation signal (varying potential) applied to the first deep and shallow control electrodes. Signal DM2 represents a demodulation signal (varying potential) applied to the second deep and shallow control electrodes. Demodulation signal DM2 may have a phase-shift of 180° with respect to demodulation signal DM1. Thus, demodulation signal DM2 may be in anti-phase with respect to demodulation signal DM1.

As indicated in FIG. 17, there is a phase difference $T_L$ between the signals M1 and S2. This phase difference $T_L$ represents the time of flight of the electromagnetic signal from the source of the electromagnetic signal to the optical sensor device. Assuming that the source of the electromagnetic signal and the optical sensor device are located close to each other, this time of flight may be considered twice the time of flight from the object to the optical sensor device.

The optical sensor device collects photo-generated charge carriers $Q_{30}$ during the first half of the modulation period in the first readout node and collects the photo-generated carriers $Q_{30a}$ during the second half of the modulation period in the second readout node. The phase-shift $T_L$ and, therefore, the distance from the object, may be determined based on a relationship between the charge carriers $Q_{30}$ and $Q_{30a}$ collected at the first and second readout nodes. The charge carriers may be collected (integrated) over several modulation periods.

In the embodiment shown in FIGS. 3A and 3B, the shallow control electrode is formed by a photo-gate electrode. By applying demodulation voltages (i.e. varying potentials) as described above to the first and second deep and shallow control electrodes, photo-generated minority charge carriers are wiped into the corresponding readout node by an electrical potential gradient. The electrical potential gradient is caused by the demodulation voltages applied to the control electrodes.

FIG. 4 shows an example of an optical sensor device similar to the optical sensor device shown in FIGS. 3A and 3B. When compared to the embodiment shown in FIGS. 3A and 3B, an elongated third shallow control electrode 60 is arranged between the first and second shallow control electrodes 26 and 26a. The control circuit 32 is coupled to the third shallow control electrode and may be configured to apply a constant potential to the third elongated shallow control electrode 60. In one or more embodiments, the varying potentials applied to the first and second shallow control electrodes may vary between zero and a first voltage, such as about 0.8 volt. A constant voltage may be applied to the elongated third shallow control electrode 60, wherein the magnitude of the voltage may be less than the maximum voltage applied to the first and second shallow control electrodes. For example, the voltage applied to the third control electrode 60 may be in the order of 50 to 80% of the maximum voltage applied to the first and second shallow control electrodes. The potential applied to the third elongated shallow control electrode 30 may be used to adjust the gradient in the electric potential towards the respective readout node.

Figure 5:
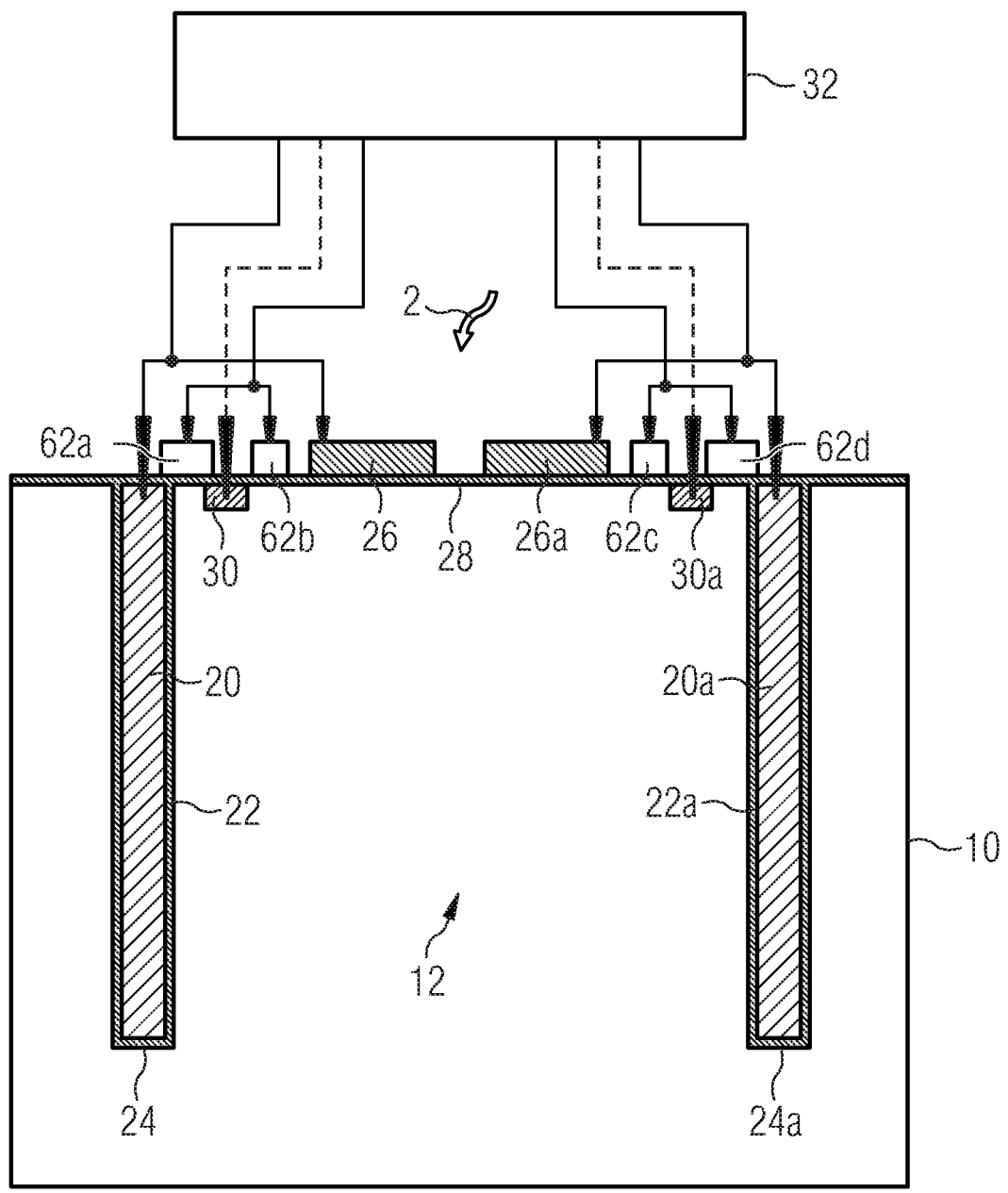
FIG. 5 shows a schematic cross-sectional view of an optical sensor device including separation electrodes.

FIG. 5 shows an embodiment of an optical sensor device similar to the optical sensor device shown in FIG. 3A. According to the embodiment shown in FIG. 5, the first deep control electrode 20 and the first shallow control electrode 26 are electrically connected to each other. In addition, the second deep control electrode 20a and the second shallow control electrode 26a are electrically connected to each other. In addition, separation gate electrode 62a, 62b, 62c and 62d are provided. Separation gate electrodes 62a and 62b are associated with first readout node 30 and separation gate electrodes 62c and 62d are associated with second readout node 30a. The separation gate electrodes may be formed as elongated stripes arranged parallel to the first direction D1. The separation gate electrodes associated with a respective readout node may be replaced by a single separation gate electrode completely surrounding the corresponding readout node. The separation gate electrodes are electrically connected to the control circuit and the control circuit may be configured to apply a constant potential to the separation gates. In one or more embodiments, a constant voltage (positive voltage in case of a p type substrate) may be applied to the separation gates, wherein the magnitude of the voltage applied to the separation gate electrodes may be between the reverse voltage applied to the readout nodes and the maximum voltage applied to the first and second deep and shallow control electrodes. For example, the voltage applied to the separation gate electrodes may be in the order of 1.0 volt to 1.5 volt. The voltage applied to the readout nodes (readout diodes) may be in the order of 2.8 V.

As explained above, the separation gates may be effective to decouple modulated parts, such as the shallow and deep control electrodes, and the readout node. In other words, the separation gate may be effective to avoid or at least reduce capacitive coupling of the electrical modulation signal of the shallow and deep control electrodes into the readout node. Thus, the separation gates may be effective to retain attracted charge carriers at the respective readout node even in case modulation potentials are applied to the first and second deep and shallow control electrodes, which provide for a gradient in the electric potential toward the other readout node.

Figure 6:
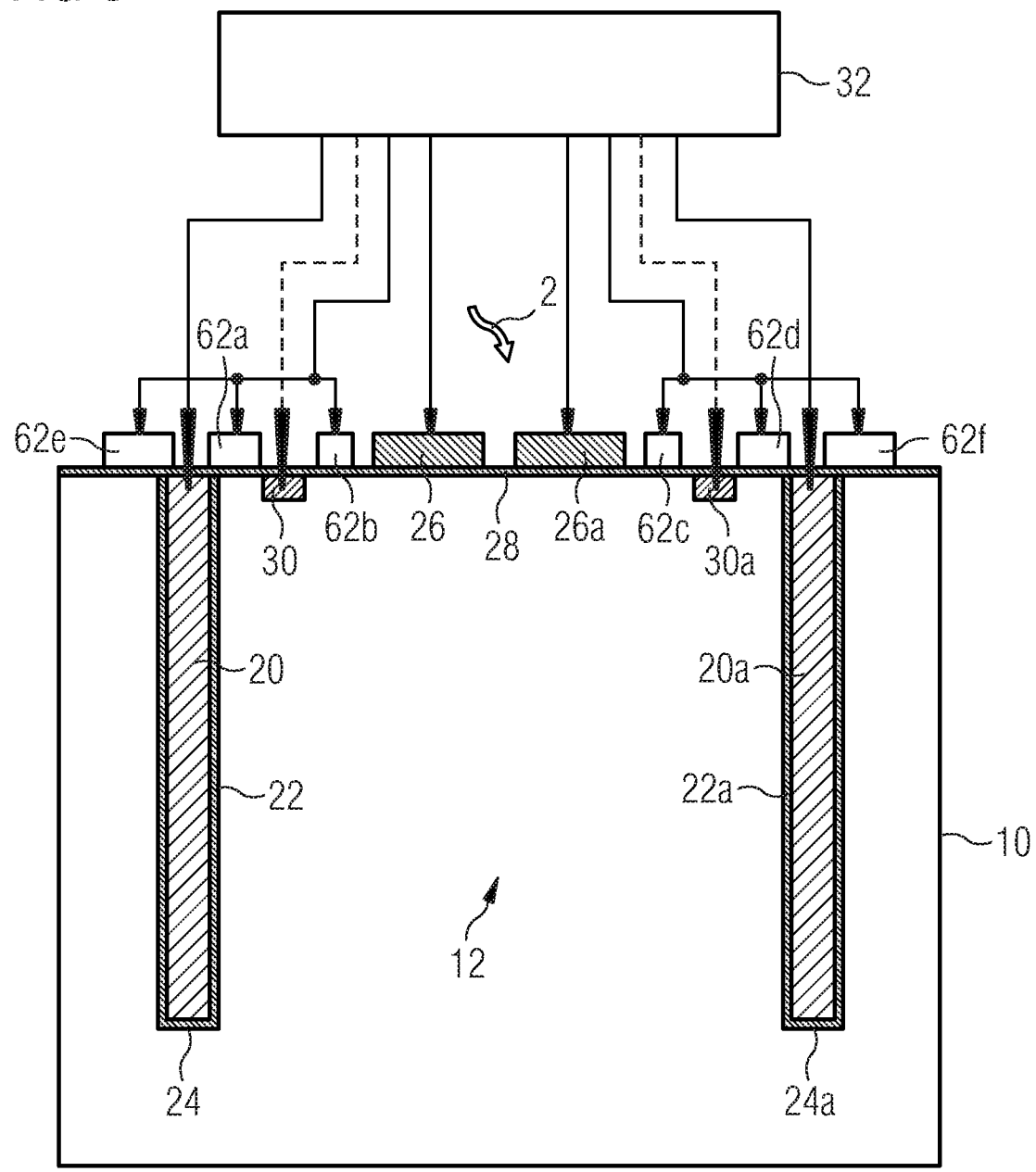
FIG. 6 shows a schematic cross-sectional view of another optical sensor device including separation electrodes.

FIG. 6 shows a schematic cross-sectional view of an embodiment similar to the embodiment shown in FIG. 5, wherein only differences when compared to the embodiment shown in FIG. 5 are described. When compared to FIG. 5, the respective deep and shallow control electrodes are not electrically connected to each other, but are separately connected to control circuit 32. Moreover, the separation gate electrodes comprise additional separation gate electrodes 62e and 62f. The separation gate electrodes 62e and 62f may be arranged on the sides of the deep control electrodes 20 and 20a, which are facing away from the conversion region 12. Thus, the first deep control electrode 20 is arranged between the separation gate electrodes 62a and 62e and the second deep control electrode 20a is arranged between the separation gate electrodes 62d and 62f. The separation gate electrodes associated with the same readout node are shown as being electrically connected to each other. Alternatively, all separation gate electrodes may be electrically connected to the control circuit 32 separately or all separation gate electrodes may be connected to each other.

Generally, the conversion region may be regarded as being arranged between the first and second deep control electrodes 20 and 20a and below the upper surface of the semiconductor substrate 10, i.e. the surface of the semiconductor substrate, on which the shallow control electrodes 26, 26a are formed. Generally, the electromagnetic signal may be incident through the electrodes arranged on the upper surface of the semiconductor substrate, which may all be implemented as photo-gate electrodes, i.e. electrodes at least partially transparent for the incident electromagnetic signal.

Different layouts of embodiments of optical sensor devices are described in the following referring to FIGS. 7 to 11. In FIGS. 7 to 11, respective terminals for an electrical connection to the respective electrodes or readout nodes (such as to the control circuit) are indicated by small squares or rectangles.

Figure 7:
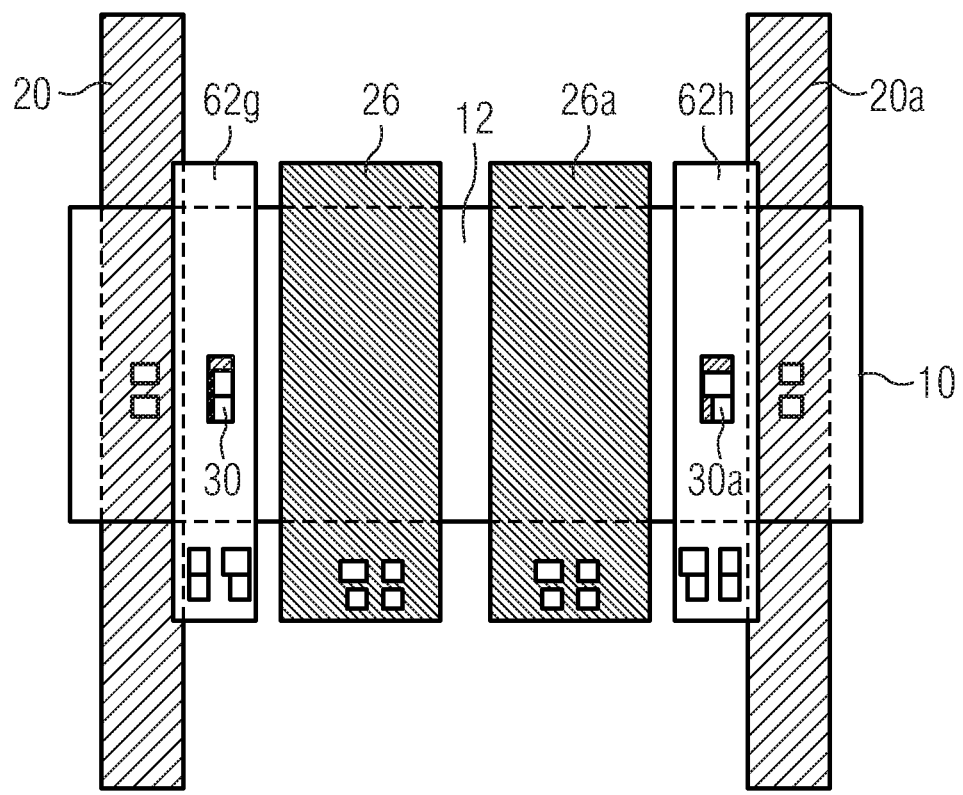
FIGS. 7 to 11 show schematic plan views of layouts of embodiments of optical sensor devices.

FIG. 7 shows a layout of an optical sensor device in a plan view. The optical sensor device comprises first and second deep control electrodes 20 and 20a, first and second shallow control electrodes 26 and 26a, first and second readout nodes 30, 30a and separation gate electrodes 62g and 62h. The separation gate electrodes 62g and 62h are provided surrounding the readout nodes 30 and 30a. In the embodiment of FIG. 7, the first deep control electrode 20 is formed as an elongated stripe formed on the side of the first readout node 30, which is facing away from the conversion region 12. The second deep control electrode 20a is formed as an elongated stripe formed on the side of the second readout node 30a, which is facing away from the conversion region 12. The first and second shallow control electrodes 26, 26a are formed as elongated stripes and are arranged between the first and second readout nodes 30, 30a so that the first shallow control electrode 26 is arranged between the first readout node 30 and the second shallow control electrode and the second shallow control electrode 26a is arranged between the first shallow control electrode 26 and the second readout gate. The separation gates are also formed as elongated stripes with openings in which the readout nodes are formed. All electrodes formed as elongated stripes are arranged in parallel to each other.

Figure 8:
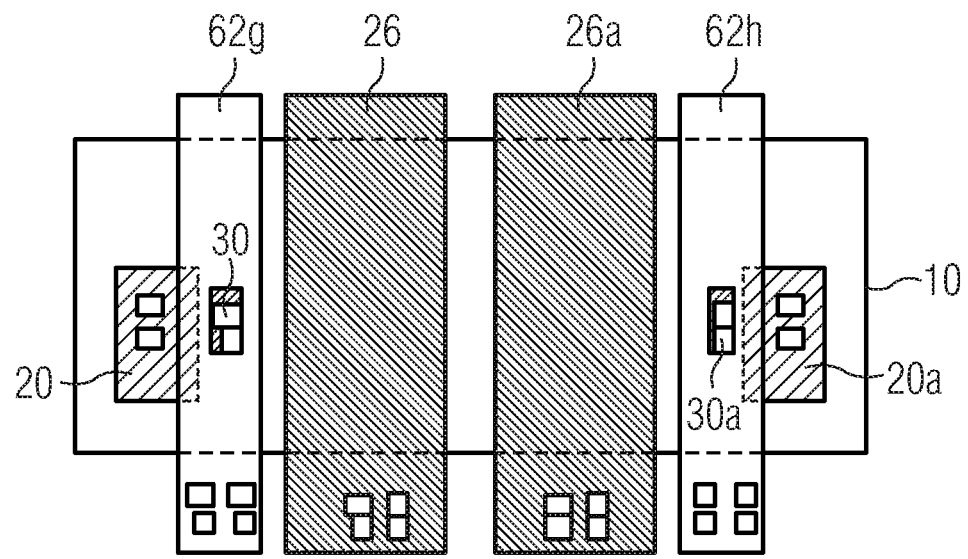

FIG. 8 shows another layout of an embodiment of an optical sensor device, in which the length of the first and second deep control electrodes 20 and 20a is reduced when compared to the embodiment shown in FIG. 8.

In one or more embodiments, the first and second shallow control electrodes may comprise elongated stripes extending in parallel to each other. The first and second deep control electrodes may comprise elongated parallel control electrode portions extending in parallel to the direction in which the first and second shallow control electrodes extend and elongated perpendicular control electrode portions extending perpendicular to the direction in which the first and second shallow control electrodes extend. Such embodiments are shown in FIGS. 9 and 10.

Figure 9:
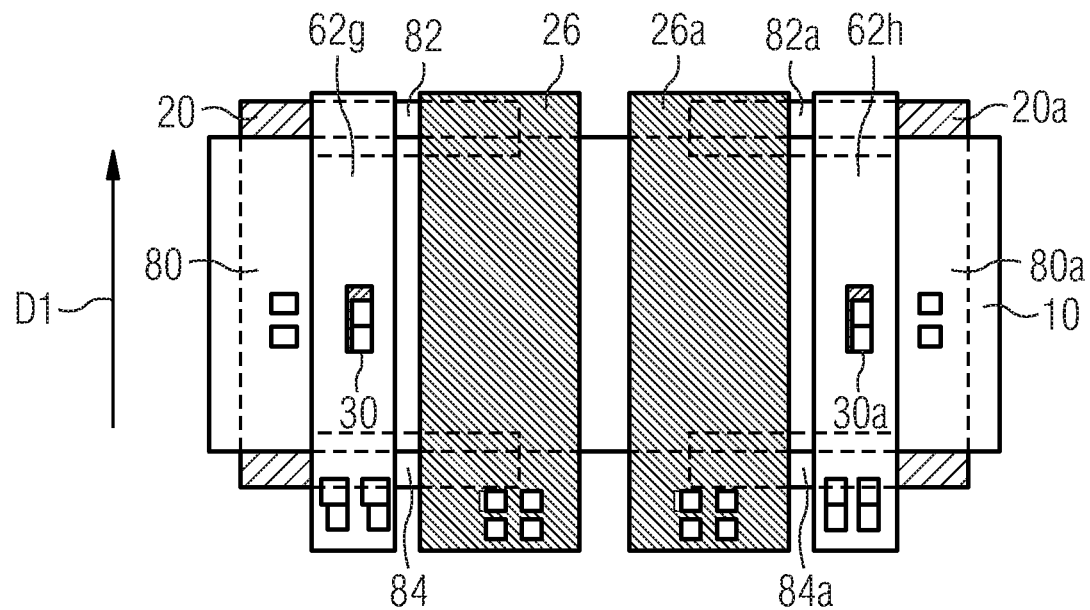

According to FIG. 9, the first and second deep control electrodes 20 and 20a comprise parallel elongated portions 80 and 80a extending in the direction D1, in which the elongated first and second shallow control electrodes 26 and 26a extend. Moreover, each of the first and second deep control electrodes comprises perpendicular elongated portions 82, 84, 82a and 84a, which extend in a direction perpendicular to the direction D1. Thus, in the embodiment shown in FIG. 9, the first and second deep control electrodes 20 and 20a are formed in the shape of the letter U. Thus, substantial portions of the conversion region may be surrounded by the deep control electrodes and, therefore, photo-generated charge carriers may be retained within the area defined by the deep control electrodes. Generally, an optical sensor device will have a plurality of pixels and, therefore, the structure shown in FIG. 9 supports retaining the charge carriers within the respective pixels. In addition, a more efficient distribution of the electric field in the conversion region may be obtained.

Figure 10:
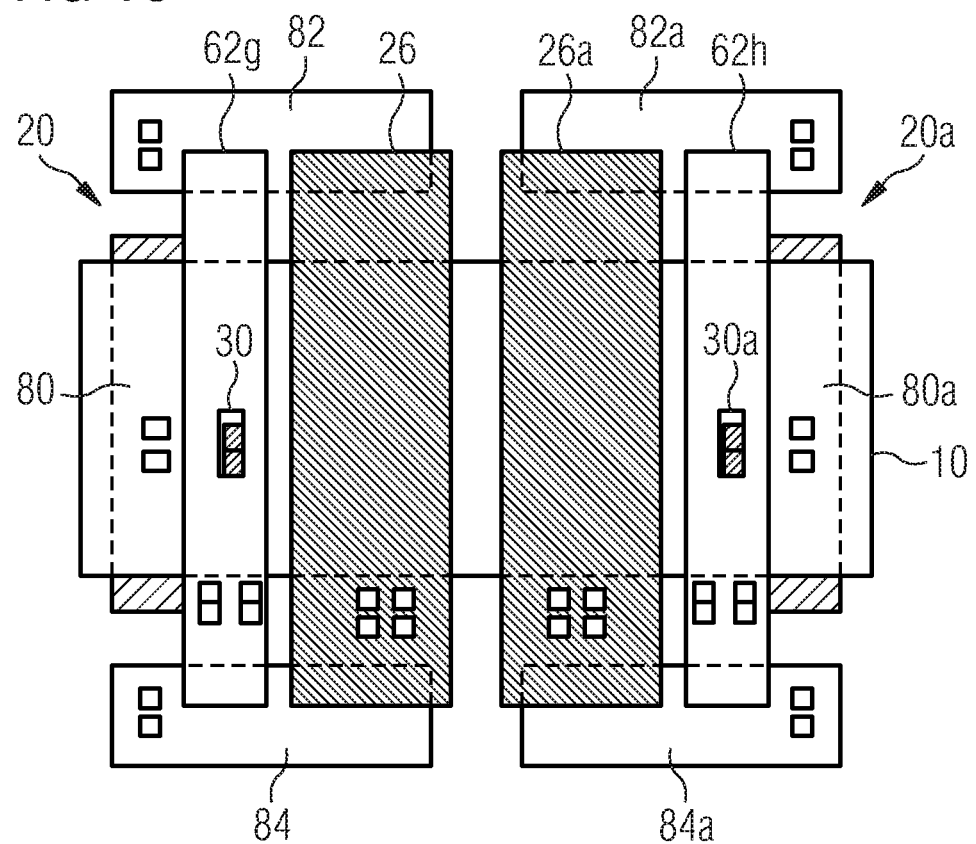

FIG. 10 shows an alternative layout, in which the respective perpendicular elongated portions 82 and 84 of the first deep control electrode 20 are separated from the parallel elongated portion 80 thereof, and in which the perpendicular elongated portions 82a and 84a of the second deep control electrode 20a are separated from the parallel elongated portion 80a thereof. The same or slightly different time varying potentials may be applied to the respective perpendicular and parallel portions of the first and second deep control electrodes 20 and 20a.

As shown in FIGS. 9 and 10, the first parallel elongated portion 80 is arranged on a first side of the first readout node 30, the second parallel elongated portion 80a is arranged on a first side of the second readout node 30a, the perpendicular elongated portions 82 and 84 are arranged on two opposite sides of the first readout node 30 different from the first side thereof, and the perpendicular elongated portions 82a and 84a are arranged on two opposite sides of the second readout node 30a different from the first side thereof.

Figure 11:
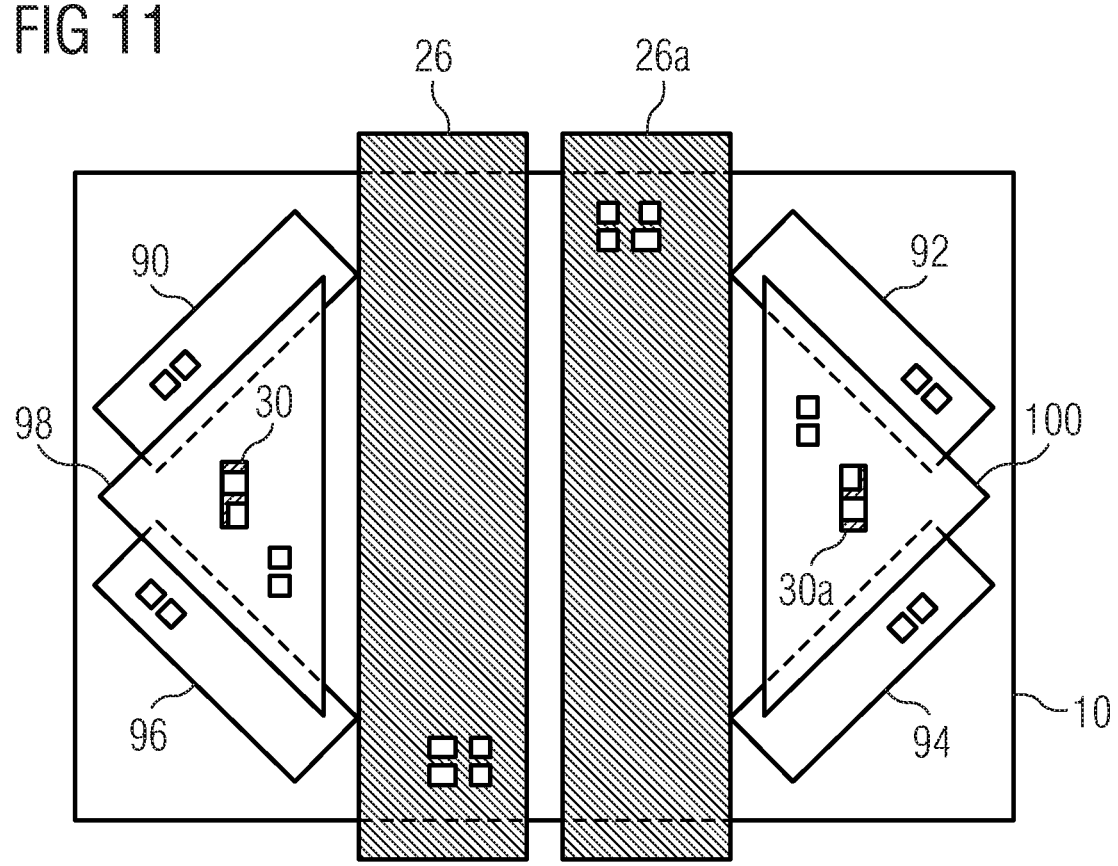

In one or more embodiments, four deep elongated control electrodes are arranged along the sides of a rhomb in a plan view of the semiconductor substrate. For example, reference is made to FIG. 11, showing an optical sensor device, in which four deep elongated control electrodes 90, 92, 94 and 96 are arranged along the sides of a rhomb. Triangle-shaped separation gate electrodes 98 and 100 are provided. Separation gate electrode 98 surrounds the first readout node 30 and separation gate electrode 100 surrounds the second readout node 30a. As can be seen from FIG. 11, respective two sides of each separation gate electrode 98 and 100 are arranged in parallel to the direction, in which the deep control electrodes 90, 92, 94 and 96 extend, and a third side of each separation gate electrode 98 and 100 is arranged parallel to the direction, in which the first and second shallow control electrodes 26 and 26a extend.

An arrangement of deep control electrodes on more than two sides of the conversion region, such as arrangements as shown in FIGS. 9 to 11, may support an effective direction of photo-generated charge carriers in the conversion region to the respective readout node.

Embodiments of optical sensor devices described herein may be manufactured using production processes typically used in the semiconductor field. In order to implement the deep control electrodes, trenches for trench gates may be etched into a semiconductor material, whereupon dielectric material may be deposited or grown on the trench walls, such as by oxidation. Thereupon, the trenches may be filled with conductive material, such as highly doped polysilicon. Thereupon, a dielectric layer may be grown upon or deposited on the semiconductor surface, such as by oxidation. The photo-gates (and if applicable the separation gates) may be formed by depositing appropriate material, such as highly doped polysilicon, and structuring the deposited material. In order to improve conductivity of the respective electrodes, additional doping via implantation may be performed. The readout nodes in the form of readout diodes may be formed by generating correspondingly doped regions via implantation. Thereupon, contacting of the control electrodes and the readout nodes may be performed.

Typically, optical sensor devices may include a plurality of pixels arranged in a line of pixels or in an array of pixels. Embodiments provide an optical sensor device comprising a plurality of pixels, each pixel comprising a structure as described herein. In addition, structures as explained herein may be adapted to receive specific colors by providing color filters in front of the conversion region, which the incident electric magnetic signal passes prior to reaching the conversion region.

In one or more embodiments, the optical sensor device comprises a plurality of pixels, wherein at least one deep control electrode is arranged between respective readout nodes of two adjacent pixels of the plurality of pixels and is used as a common deep control electrode for both adjacent pixels.

Figure 12:
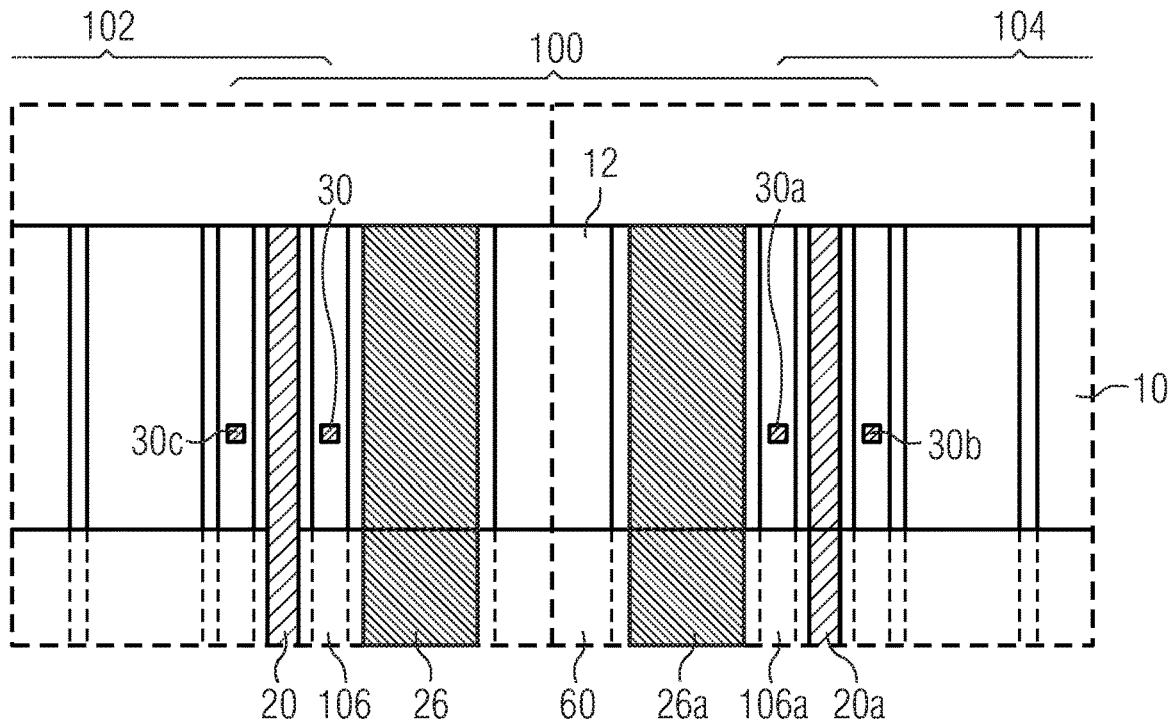
FIGS. 12 and 13 show schematic plan views of optical sensor devices in which deep control electrodes are arranged between adjacent pixels of the optical sensor device.

FIG. 12 shows a schematic view of a pixel 100 of an optical sensor device. FIG. 12 shows the structures associated with a first pixel 100 and part of the structures associated with neighboring pixels 102 and 104. Pixel 100 comprises first and second deep control electrodes 20 and 20a, first and second shallow control electrodes 26 and 26a, and a third shallow control electrode 60. In addition, pixel 100 comprises a first readout node 30 and a second readout node 30a. A first separation gate electrode 106 is provided surrounding the first readout node 30 and a second separation gate electrode 106a is provided surrounding the second readout node 30a.

Pixels 102 and 104 adjacent to pixel 100 have a similar structure, wherein the first deep control electrode 20 is common to pixels 100 and 102 and the second deep control electrode 20a is common to pixels 100 and 104. Thus, in embodiments, a deep control electrode is arranged between a readout node 30 associated with a first pixel and a readout node 30c associated with a neighboring pixel. The readout nodes 30 and 30c may be electrically connected to each other. Thus, such readout nodes separated by a deep control electrode may be regarded as representing a single readout node. Areas above and/or below the conversion region of the pixel structure shown in FIG. 12 may be dedicated to readout circuitry and driver circuitry of the respective pixels.

Figure 13:
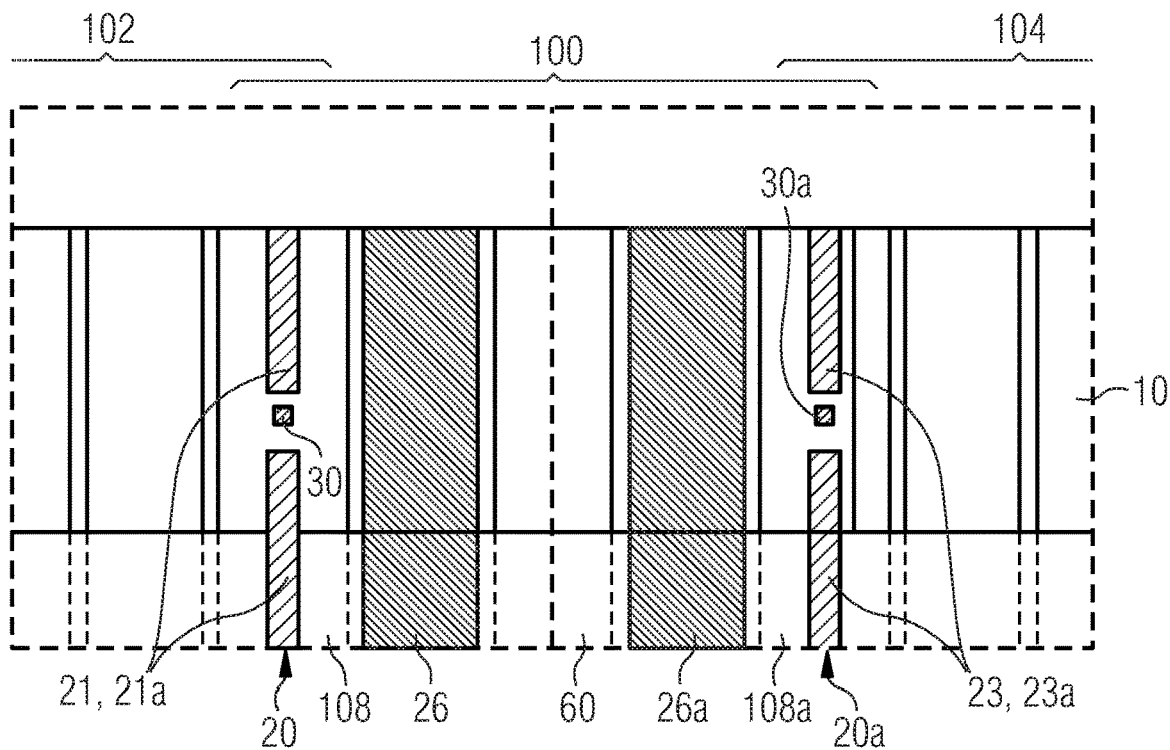

FIG. 13 shows a schematic plan view of another embodiment, in which deep control electrodes are common to neighboring pixels, wherein differences when compared to the structure shown in FIG. 12 are now explained. According to the embodiment shown in FIG. 13, the common deep control electrode 20 is broken into two segments 21 and 21a and the common deep control electrode 20a is broken into two segments 23 and 23a. The readout node 30 is arranged in the space between segments 21 and 21a, and the readout node 30a is arranged in the space between the segments 23 and 23a. Thus, in the embodiment shown in FIG. 13, the readout node 30 is common to pixels 100 and 102 and the readout node 30a is common to pixels 100 and 104. Moreover, separation gate electrodes 108 and 108a are shown in FIG. 13. The separation gate electrodes 108 and 108a surround the associated readout node 30 and 30a, respectively. Thus, the separation gate electrode 108 may be regarded as being common to both pixels 100 and 102 and the separation gate electrode 108a may be regarded as being common to both pixels 100 and 104.

In the embodiment shown in FIG. 13, a single readout node (integration node) is provided common to both neighboring pixels and the deep control electrodes 20 and 20a (trench gate electrodes) are separated at a center thereof so that deep control electrodes 20, 20a comprise two halves. The structure shown in FIG. 12 comprises a continuous deep control electrode or trench gate control electrode extending between neighboring pixels and, therefore, crosstalk performance may be increased when compared to the structure shown in FIG. 13. However, the required chip area for the structure shown in FIG. 13 may be less than the required chip area for the structure shown in FIG. 12 so that the design shown in FIG. 13 may allow a higher fill factor.

Embodiments described herein use a current-assisted photonic demodulation. In one or more embodiments, the shallow control electrode comprises a doped region formed in the semiconductor substrate, bordering the conversion region and having a higher doping concentration and the same doping type as the conversion region.

Figure 14:
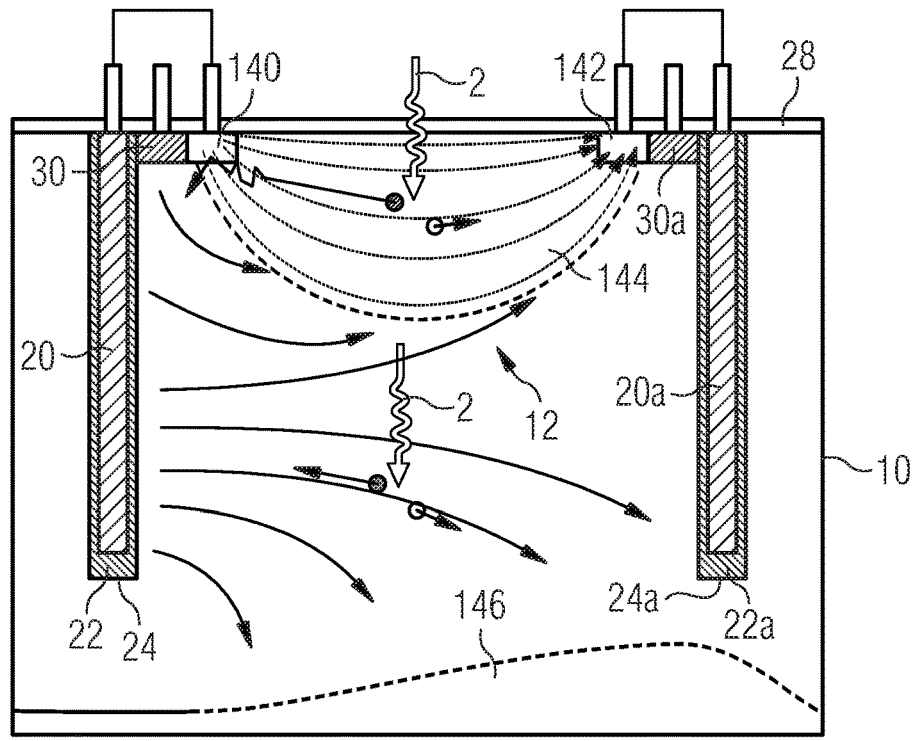
FIG. 14 shows a schematic cross-sectional view of an optical sensor device, in which shallow control electrodes comprise doped regions.

For example, FIG. 14 shows a schematic cross-sectional view of an optical sensor device comprising first and second shallow control electrodes 140 and 142, each of which formed by a doped region within the semiconductor substrate. To be more specific, doped regions 140 and 142 are doped with the same doping type as the conversion region 12, but with a higher doping concentration. For example, the doped regions 140 and 142 may be p$^+$ doped regions. As indicated in FIG. 14, the first shallow control electrode 140 may be electrically connected to the first deep control electrode 20 and the second shallow control electrode 142 may be electrically connected to the second deep control electrode 20a. Readout node 30 is arranged between first shallow control electrode 140 and first deep control electrode 20 and readout node 30a is arranged between second shallow control electrode 142 and second deep control electrode 20a.

Applying varying potentials to the shallow control electrodes 140 and 142 causes a majority carrier current flow between the control electrodes 140 and 142. The control electrodes 140 and 142 may be referred to as guide field electrodes. The majority carrier current flow causes a majority carrier current drift field 144 and photo-generated minority charge carriers drift along the guide field lines of the majority carrier current drift field 144. Close to the shallow control electrodes 140, 142 the drift field becomes small and, thus, diffusion may become the dominant transport mechanism. The neighboring depletion region of the readout nodes 30 and 30a is an effective sink for the minority charge carriers. In addition, a drift field demodulation deep within the substrate may be achieved using the modulated potentials of the deep control electrodes 20 and 20a. Also shown in the schematic view of FIG. 14 is an undepleted/neutral semiconductor region 146.

Figure 15:
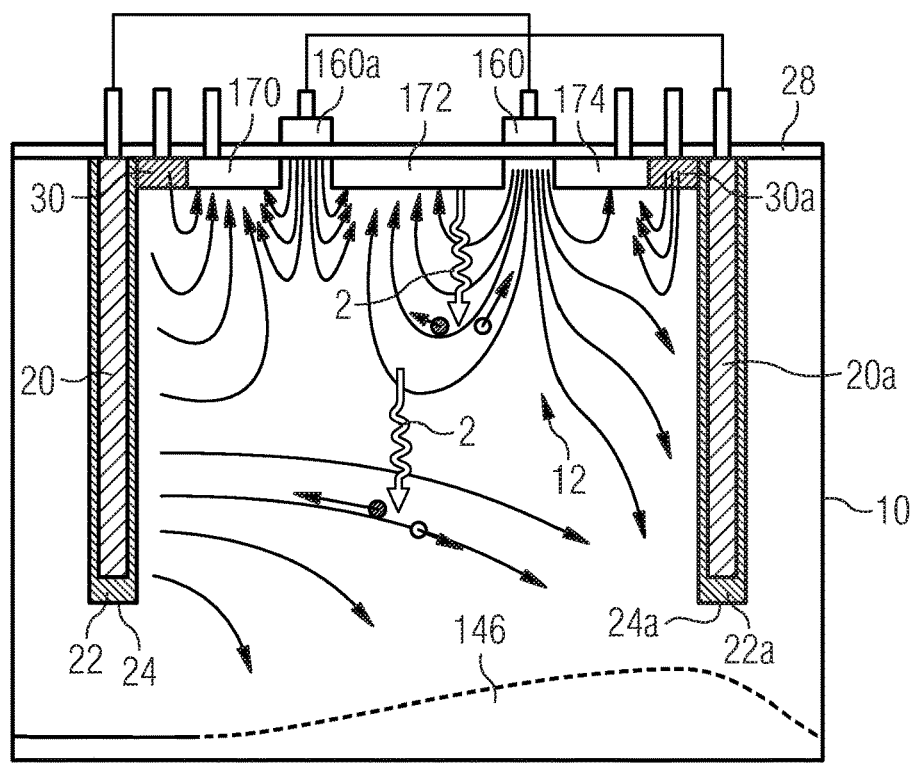
FIG. 15 shows a schematic cross-sectional view of an optical sensor device including doped regions between shallow control electrodes.
Figure 16:
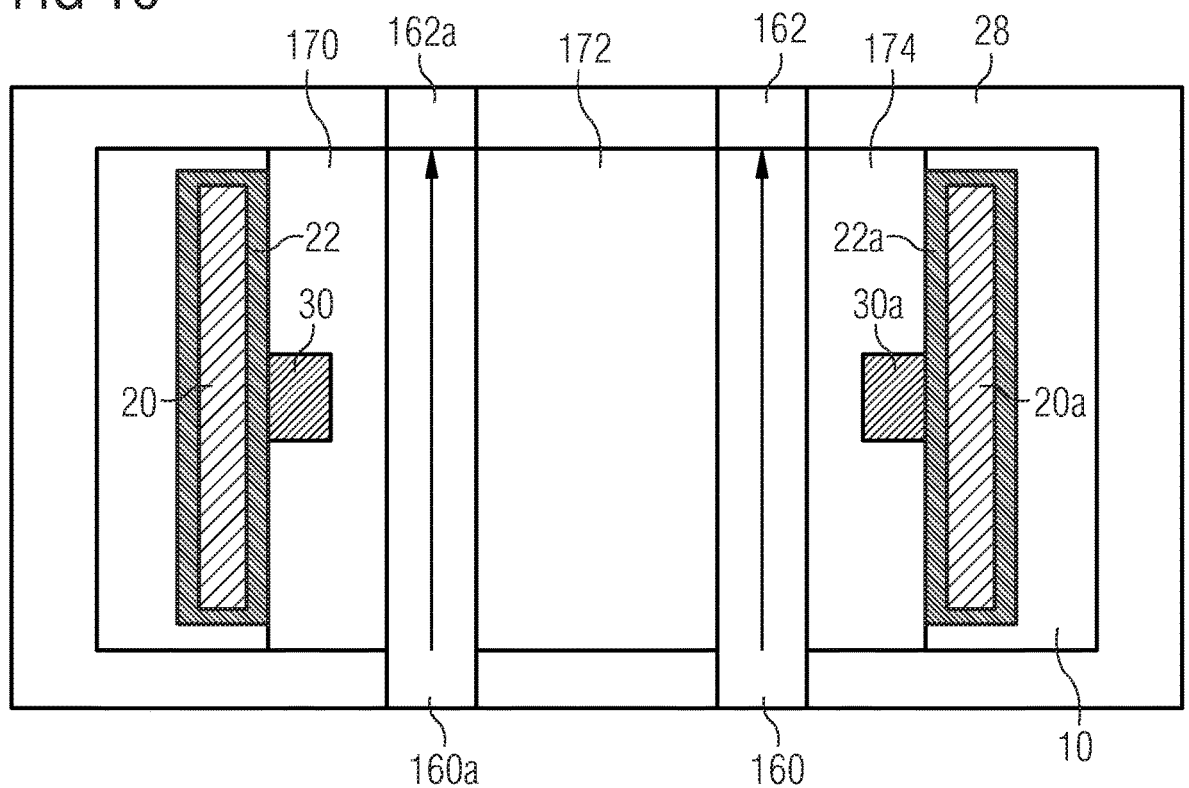
FIG. 16 shows a schematic plan view of the optical sensor device shown in FIG. 15.

Embodiments of the disclosure may also use a quantum-efficiency modulation at the surface of the semiconductor region. A schematic close-sectional view of an embodiment using quantum-efficiency modulation is shown in FIG. 15 and a schematic plan view thereof is shown in FIG. 16. The embodiment of an optical sensor device comprises first and second deep control electrodes 20, 20a, first and second readout nodes 30, 30a, first and second shallow control electrodes 160 and 160a, and third and fourth readout nodes 162 and 162a (FIG. 16). Moreover, the optical sensor device shown in FIGS. 15 and 16 comprises shallow doped regions 170, 172 and 174. The shallow doped regions 170, 172 and 174 have a higher doping concentration and the same doping time as the conversion region 12. The shallow doped regions may be p$^+$ doped regions. The shallow doped regions 170 is arranged between the first readout node 30 and the second shallow control electrode 160a, the shallow doped region 172 is arranged between the second shallow control electrode 160a and the first shallow control electrode 160, and the shallow doped region 174 is arranged between the first shallow control electrode 160 and the second readout node 30a. The third readout node 162 is arranged at one end of the first shallow control electrode 160 and the fourth readout node 162a is arranged at one end of the second shallow control electrode 160a.

As shown in FIG. 15, the first deep control electrode 20 and the first shallow control electrode 160 may be electrically connected to each other and the second deep control electrode 20a and the second shallow control electrode 160a may be electrically connected to each other. Although not shown in the figures, the first readout node 30 may be electrically connected to the third readout node 162 and the second readout node 30a may be electrically connected to the fourth readout node 162a.

In a modification of the embodiment shown in FIGS. 15 and 16, the first shallow control electrode 160 and the associated third readout node 162 may be arranged between the first readout node 30, and the second shallow control electrode 160a and the associated fourth readout node 162a may be arranged between the second readout node 30a and the first shallow control electrode 160. In other words, the positions of the first and second shallow control electrodes 160, 160a shown in FIGS. 15 and 16 may be exchanged.

In operation, varying potentials as explained above may be applied to the first and second deep and shallow control electrodes. Moreover, a reverse voltage is applied to the readout nodes. Applying the corresponding potentials at the first and second shallow control electrodes 160, 160a in conjunction with the highly doped regions 170, 172, 174 creates a field distribution that directs the minority carriers to the desired region. The minority carriers are directed to the surface by the first and the second shallow control electrodes 160, 160a. Once they reach the surface they are stored at the respective control electrode 160 and 160a due to the highly doped regions 170, 172 and 174. They are stored at the respective control electrode even at the low-phase voltage of the varying potential applied to the control electrodes. Transport of the minority charge carriers to the readout nodes 162 and 162a takes place along the length of the control electrodes 162 and 162a in the direction indicated by the arrows in FIG. 16. Thus, quantum-efficiency modulation takes place. In one or more embodiments, this quantum-efficiency modulation is combined with a drift-field demodulation using the varying potentials applied to the deep control electrodes 20 and 20a.

Generally, the corresponding voltages to be applied to the respective electrodes depend on the doping type of the conversion region and the doping concentration. Generally, the reverse voltage applied to the readout nodes may be the highest voltage, for example in a range of 2.5 to 3.5 volt. The potential applied to the deep and shallow control electrodes may be of the same polarity but substantially lower than the voltages applied to the readout nodes. For example, the potential applied to the control electrodes may vary between 0 and 0.8 volt. The potential applied to separation gate electrodes may be lower than the voltages applied to the readout nodes, but higher than the maximum voltage applied to the control electrodes. For example, the voltages applied to separation gate electrodes may be in a range of 1.0 to 1.5 volt. In case of a shallow third control electrode between the first and second shallow control electrodes, the voltage applied thereto may be 40 to 80% of the maximum voltage applied to the first and second shallow control electrodes. For example, the voltage applied to the shallow third control electrode may be in a range of 0.4 volt to 0.64 volt. Generally, the first shallow control electrode and the first deep control electrode may be electrically connected to each other. Likewise, the second deep control electrode and the second shallow control electrode may be electrically connected to each other. In other embodiments, separate control circuitry may be provided to apply the respective varying potentials to the first deep and shallow control electrodes and the second deep and shallow control electrodes.

In one or more embodiments, the photo-generated charge carriers may be directed to respective readout nodes by the electric potential distributions generated by applying varying voltages to the deep and shallow control electrodes. In one or more embodiments, the photo-generated charge carriers may be separated dependent on the time of flight of the electromagnetic signal.

Embodiments may provide for an efficient separation of minority charge carriers in an optical sensor device to detect a time of flight of an electromagnetic signal. Embodiments permit for detecting the time of flight of an electromagnetic signal from an object to the optical sensor device and, therefore, detecting the distance between the object and the optical sensor device.

Embodiments disclosed herein provide optical sensors utilizing trench gate electrodes in combination with photo-gate electrodes to direct photo-generated charge carriers. Embodiments utilize a combination of trench gate electrodes with photo-gate electrodes and additionally use a quantum-efficiency modulation in order to direct or separate photo-generated charge carriers. Embodiments disclosed herein utilize trench gate electrodes in addition with a current assisted demodulation using doped shallow control electrodes causing a majority of charge carrier current to direct or separate photo-generated minority carriers in the optical sensor device.

In one or more embodiments, the control circuit may be formed of any appropriate integrated circuit and may be integrated with the optical sensor device. In one or more embodiments, the control circuit may be provided by an integrated circuit separate from the semiconductor substrate of the optical sensor device. In one or more embodiments, at least parts of the control circuit may be formed by a microprocessor or an FPGA.

The above described embodiments are merely illustrative for the principles of the present disclosure. It is understood that modifications and variations of the arrangements and the details described herein will be apparent to others skilled in the art. It is the intent, therefore, to be limited only by the scope of the following claims and not by the specific details presented by way of description and explanation of the embodiments herein.

What is claimed is:

1. An optical sensor device configured to detect a time of flight of an electromagnetic signal, the optical sensor device comprising:
    a semiconductor substrate comprising a main surface and a conversion region configured to convert at least a fraction of the electromagnetic signal into photo-generated charge carriers;
    a first control electrode which is formed in a trench extending from the main surface into the semiconductor substrate;
    a second control electrode disposed directly or indirectly on the main surface;
    a control circuit configured to apply a varying first potential to the first control electrode and to apply a varying second potential to the second control electrode, wherein the varying second potential has a fixed phase relationship to the first varying potential, to generate electric potential distributions in the conversion region to direct the photo-generated charge carriers; and
    a readout node arranged in the semiconductor substrate and configured to detect the directed photo-generated charge carriers,
    wherein the varying first potential is a demodulation signal having a fixed phase relationship with a modulation signal with which the electromagnetic signal is modulated.

2. The optical sensor device of claim 1, further comprising:
    an isolating material disposed on the main surface and interposed between the semiconductor substrate and the second control electrode.

3. The optical sensor device of claim 1, wherein:
    the first control electrode is separated from the semiconductor substrate by a trench isolating material, and
    the first control electrode and the trench isolating material are formed in the trench extending into the semiconductor substrate.

4. The optical sensor device of claim 1, wherein the varying first potential and the varying second potential are the same.

5. The optical sensor device of claim 4, wherein the second control electrode is a photo-gate electrode that is at least partially transparent for the electromagnetic signal.

6. The optical sensor device of claim 1, wherein the second control electrode is a gate electrode separated from the main surface of the semiconductor substrate by an isolating material.

7. The optical sensor device of claim 1, further comprising:
    a separation gate electrode arranged on the main surface of the semiconductor substrate and adjacent to the readout node.

8. The optical sensor device of claim 7, wherein the separation gate electrode surrounds the readout node in a plan view of the semiconductor substrate.

9. The optical sensor device of claim 8, wherein the separation gate electrode overlaps with the first control electrode in the plan view of the semiconductor substrate.

10. An optical sensor device configured to detect a time of flight of an electromagnetic signal, the optical sensor device comprising:
- a semiconductor substrate comprising a main surface and a conversion region configured to convert at least a fraction of the electromagnetic signal into photo-generated charge carriers;
- a first control electrode which is formed in a trench extending from the main surface into the semiconductor substrate;
- a second control electrode disposed directly or indirectly on the main surface;
- a control circuit configured to apply a varying first potential to the first control electrode and to apply a varying second potential to the second control electrode, wherein the varying second potential has a fixed phase relationship to the first varying potential, to generate electric potential distributions in the conversion region to direct the photo-generated charge carriers;
- a readout node arranged in the semiconductor substrate and configured to detect the directed photo-generated charge carriers; and
- a separation gate electrode arranged on the main surface of the semiconductor substrate and adjacent to the readout node, wherein the control circuit is configured to apply a constant potential to the separation gate electrode.

11. The optical sensor device of claim 1, wherein the first control electrode is arranged on a first side of the readout node and the second control electrode is arranged on a second side of the readout node in a plan view of the semiconductor substrate.

12. The optical sensor device of claim 1, wherein the first control electrode and the second control electrode are electrically connected to each other.

13. An optical sensor device configured to detect a time of flight of an electromagnetic signal, the optical sensor device comprising:
- a semiconductor substrate comprising a main surface and a conversion region configured to convert at least a fraction of the electromagnetic signal into photo-generated charge carriers;
- a first control electrode which is formed in a first trench extending from the main surface into the semiconductor substrate;
- a second control electrode disposed directly or indirectly on the main surface;
- a third control electrode which is formed in a second trench extending from the main surface into the semiconductor substrate;
- a fourth control electrode disposed directly or indirectly on the main surface;
- a control circuit configured to apply a varying first potential to the first control electrode, apply a varying second potential to the second control electrode, apply a varying third potential to the third control electrode, and apply a varying fourth potential to the fourth control electrode,
- wherein the varying second potential has a first fixed phase relationship to the first varying potential, to generate first electric potential distributions in the conversion region to direct first photo-generated charge carriers,
- wherein the varying fourth potential has a second fixed phase relationship to the third varying potential, to generate second electric potential distributions in the conversion region to direct second photo-generated charge carriers;
- a first readout node arranged in the semiconductor substrate and configured to detect the directed first photo-generated charge carriers; and
- a second readout node arranged in the semiconductor substrate and configured to detect the directed second photo-generated charge carriers,
- wherein, in a plan view of the semiconductor substrate, the second and the fourth control electrodes are arranged between the first and the second readout nodes and between the first and the third control electrodes.

14. The optical sensor device of claim 13, wherein the control circuit is configured to determine the time of flight of the electro-magnetic signal based on a relationship of an amount of charge carriers collected at the first readout node and an amount of charge carriers collected at the second readout node.

15. The optical sensor device of claim 13, wherein, in the plan view of the semiconductor substrate, the first and the third control electrodes, the second and the fourth control electrodes, and the first and the second readout nodes are arranged symmetrically with respect to an axis of symmetry.

16. The optical sensor device of claim 13, wherein:
- the second and the fourth control electrodes comprise elongated control electrodes having an elongated dimension extending in parallel to a first direction, and
- the first and the third first control electrodes comprise elongated parallel control electrode portions having an elongated dimension extending in parallel to the first direction.

17. The optical sensor device of claim 16, wherein the first and the third control electrodes further comprise elongated perpendicular control electrode portions having an elongated dimension extending perpendicular to the first direction.

18. The optical sensor device of claim 17, wherein:
- the elongated parallel control electrode portions comprise:
- a first elongated parallel control electrode portion of the first control electrode laterally arranged from a first side of the first readout node; and
- a second elongated parallel control electrode portion of the third control electrode laterally arranged from a first side of the second readout node, and
- elongated perpendicular control electrode portions comprise:
- a first elongated perpendicular control electrode portion and a second elongated perpendicular control electrode portion extending from the first elongated parallel control electrode portion such that the first elongated perpendicular control electrode portion and the second elongated perpendicular control electrode portion are arranged laterally from two opposite sides of the first readout node different from the first side thereof; and
- a third elongated perpendicular control electrode portion and a fourth elongated perpendicular control electrode portion extending from the second elongated parallel control electrode portion such that the third elongated perpendicular control electrode portion and the fourth elongated perpendicular control electrode portion are arranged laterally from two opposite sides of the second readout node different from the first side thereof.

19. The optical sensor device of claim 13, wherein:

the first and the third control electrodes have an elongated dimension extending along different sides of a rhomb projected onto the main surface in a plan view of the semiconductor substrate.

20. The optical sensor device of claim 13, further comprising:
a fifth control electrode is arranged between the second and the fourth control electrodes, and
wherein the control circuit is configured to apply a constant potential to the fifth control electrode.

21. The optical sensor device of claim 13, wherein the semiconductor substrate comprises a first shallow doped region, a second shallow doped region, and a third shallow doped region each formed in the semiconductor substrate by extending from the main surface into the semiconductor substrate,
wherein the first shallow doped region is formed between the first readout node and the second control electrode, the second shallow doped region is formed between the second and the fourth control electrodes, and the third shallow doped region is formed between the second readout node and the fourth control electrode, and
wherein the first, the second, and the third shallow doped regions each have a higher doping concentration than the conversion region and a doping type different from the first and the second read out nodes.

22. The optical sensor device of claim 21, wherein:
the second control electrode is arranged between the first readout node and the fourth control electrode, and the fourth control electrode is arranged between the second readout node and the second control electrode.

23. The optical sensor device of claim 21, further comprising:
a third readout node arranged at one end of the second control electrode; and
a fourth readout node arranged at one end of the fourth control electrode,
wherein the third readout node is electrically connected to the first readout node and the fourth readout node is electrically connected to the second readout node.

24. The optical sensor device of claim 13, further comprising:
a plurality of pixels, wherein the first control electrode is arranged between respective readout nodes of two adjacent pixels of the plurality of pixels and is used as a common control electrode for the two adjacent pixels.

25. The optical sensor device of claim 13, further comprising:
a plurality of pixels,
wherein the first control electrode is used as a common control electrode for two adjacent pixels of the plurality of pixels, and
wherein the common control electrode is broken along a length thereof so that a space is formed between two segments of the common control electrode, wherein the first readout node is arranged in the space between the two segments of the common control electrode and the first read out node is used as a common read out node for the two adjacent pixels.

26. An optical sensor device configured to detect a time of flight of an electromagnetic signal, the optical sensor device comprising:
a semiconductor substrate comprising a main surface and a conversion region configured to convert at least a fraction of the electromagnetic signal into photo-generated charge carriers;
a first control electrode which is formed in a trench extending from the main surface into the semiconductor substrate;
a second control electrode disposed directly or indirectly on the main surface;
a control circuit configured to apply a varying first potential to the first control electrode and to apply a varying second potential to the second control electrode, wherein the varying second potential has a fixed phase relationship to the first varying potential, to generate electric potential distributions in the conversion region to direct the photo-generated charge carriers; and
a readout node arranged in the semiconductor substrate and configured to detect the directed photo-generated charge carriers,
wherein the varying first potential and the varying second potential are the same.

27. An optical sensor device configured to detect a time of flight of an electromagnetic signal, the optical sensor device comprising:
a semiconductor substrate comprising a main surface and a conversion region configured to convert at least a fraction of the electromagnetic signal into photo-generated charge carriers;
a first control electrode which is formed in a trench extending from the main surface into the semiconductor substrate;
a second control electrode disposed directly or indirectly on the main surface;
a control circuit configured to apply a varying first potential to the first control electrode and to apply a varying second potential to the second control electrode, wherein the varying second potential has a fixed phase relationship to the first varying potential, to generate electric potential distributions in the conversion region to direct the photo-generated charge carriers;
a readout node arranged in the semiconductor substrate and configured to detect the directed photo-generated charge carriers; and
a separation gate electrode arranged on the main surface of the semiconductor substrate and adjacent to the readout node, wherein the separation gate electrode surrounds the readout node in a plan view of the semiconductor substrate.

* * * * *